(12) United States Patent
Stansell

(10) Patent No.: US 6,559,726 B1
(45) Date of Patent: May 6, 2003

(54) MULTI-MODULUS COUNTER IN MODULATED FREQUENCY SYNTHESIS

(75) Inventor: Galen E. Stansell, Kirkland, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/999,743

(22) Filed: Oct. 31, 2001

(51) Int. Cl.⁷ .............................. H03L 7/18; H03K 23/00
(52) U.S. Cl. ........................ 331/16; 331/1 A; 331/25; 327/117; 327/156; 327/159; 327/115
(58) Field of Search ............................ 331/1 A, 16, 18, 331/25; 327/115, 117, 118, 156–159; 332/127; 360/51; 375/376; 455/260

(56) References Cited

U.S. PATENT DOCUMENTS

| | | | |
|---|---|---|---|
| 4,325,031 A | * 4/1982 | Ooms et al. | 331/1 A |
| 4,689,740 A | 8/1987 | Moelands et al. | 364/200 |
| 4,864,643 A | * 9/1989 | French et al. | 455/302 |
| 4,935,944 A | 6/1990 | Everett | 377/48 |
| 5,084,907 A | 1/1992 | Maemura | 377/28 |
| 5,172,400 A | 12/1992 | Maemura | 377/116 |
| 5,559,502 A | 9/1996 | Schutte | 340/825.21 |
| 5,689,196 A | 11/1997 | Schutte | 326/86 |
| 5,867,068 A | 2/1999 | Keating | 331/1 A |
| 6,163,181 A | 12/2000 | Nishiyama | 327/115 |

FOREIGN PATENT DOCUMENTS

| | | | |
|---|---|---|---|
| WO | WO 96/17305 | 6/1996 | G06F/13/40 |
| WO | WO 98/34376 | 8/1998 | H04L/12/20 |
| WO | WO 99/09712 | 2/1999 | H04L/12/40 |

OTHER PUBLICATIONS

Cypress CY24131, "Display Panel Spread Spectrum Clock Generator", Dec. 2000, pp. 1–4.
Galen E. Stansell, "Loadable Divide–By–N With Fixed Duty Cycle", U.S. Ser. No. 09/607,697, filed Jun. 30, 2000.

* cited by examiner

*Primary Examiner*—David C. Mis
(74) *Attorney, Agent, or Firm*—Christopher P. Maiorana, P.C.

(57) ABSTRACT

An apparatus comprising a first circuit and a second circuit. The first circuit may be configured to generate an output signal in response to a reference input and a feedback signal. The second circuit may be configured to generate the feedback signal according to a plurality of moduli in response to the output signal, a first control signal and a second control signal. The frequency of the output signal may be modulated in response to the second control signal.

20 Claims, 4 Drawing Sheets

MULTI-MODULUS COUNTER IN MODULATED FREQUENCY SYNTHESIS

FIELD OF THE INVENTION

The present invention relates to a method and/or architecture for implementing programmable frequency modulation generally and, more particularly, to a method and/or architecture for implementing a multi-modulus counter in modulated frequency synthesis.

BACKGROUND OF THE INVENTION

Referring to FIG. 1, a block diagram of a circuit 10 is shown. The circuit 10 is a conventional modulated frequency synthesizer. The conventional approach employs a loadable counter 12 and an adder 14 in a feedback path of a phase-locked loop (PLL) 16 configured for frequency synthesis. A sum output of the adder 14 is loaded into the counter 12. The first addend is a base PLL feedback divisor value PB and the second addend is an offset from the base PLL feedback divisor value PO. The offset value PO can be provided from a lookup table 18. The offset value PO can be any integer within the bounds of the adder 14 and counter 12. The total feedback divisor PT is given by the equation PT=PB+PO. The adder 14 is used when the offset values PO are small compared to the base feedback divisor value PB. Supplying an offset instead of a full feedback divisor value reduces the size of the lookup table 18.

Referring to FIG. 2, a block diagram of a circuit 20 is shown. The circuit 20 is similar to the circuit 10 except that a high speed PLL 16' is employed. The loadable counter 12 can be unable to operate at the speed of a voltage controlled oscillator (VCO) of the PLL 16'. To allow the loadable counter 12 to operate at a lower speed than the PLL 16', the loadable counter 12 can be preceded by a prescaler 22. The prescaler 22 can be implemented as a fixed divide-by-N circuit, where N is any integer greater than or equal to 2. Because the prescaler 22 precedes the loadable counter 12, the prescaler 22 multiplies the total feedback divisor, resulting in a total feedback divisor equation of PT=N*(PB+PO), or PT=(N*PB)+(N*PO). Because the offset value PO is multiplied by the prescaler value N, the frequency resolution between adjacent PLL feedback divisor values is reduced. Reducing the frequency resolution makes frequency modulation synthesis with the circuit 20 more sensitive to PLL loop gain, hindering performance and resulting in more variation across process and environmental conditions.

SUMMARY OF THE INVENTION

The present invention concerns an apparatus comprising a first circuit and a second circuit. The first circuit may be configured to generate an output signal in response to a reference input and a feedback signal. The second circuit may be configured to generate the feedback signal according to a plurality of moduli in response to the output signal, a first control signal and a second control signal. The frequency of the output signal may be modulated in response to the second control signal.

The objects, features and advantages of the present invention include providing a method and/or architecture for implementing a multi-modulus counter in a modulated frequency synthesizer that may (i) use a multi-modulus counter in place of a fixed prescaler, a loadable counter and an adder to achieve the synthesis of frequency modulation, (ii) use a multi-modulus counter to synthesize a modulation profile, and/or (iii) provide spread spectrum modulated frequency synthesis or clocking.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
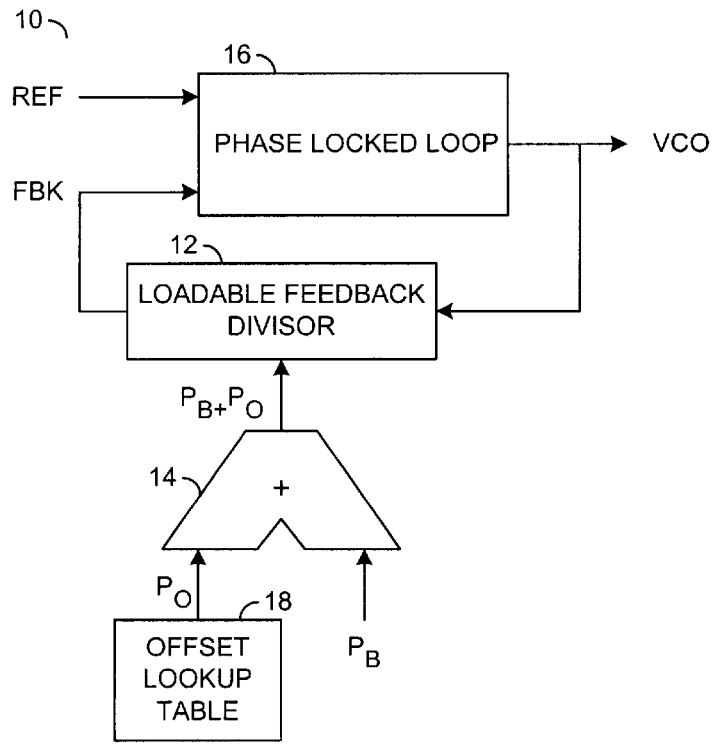
FIG. 1 is a block diagram of a conventional frequency synthesis circuit.
Figure 2:
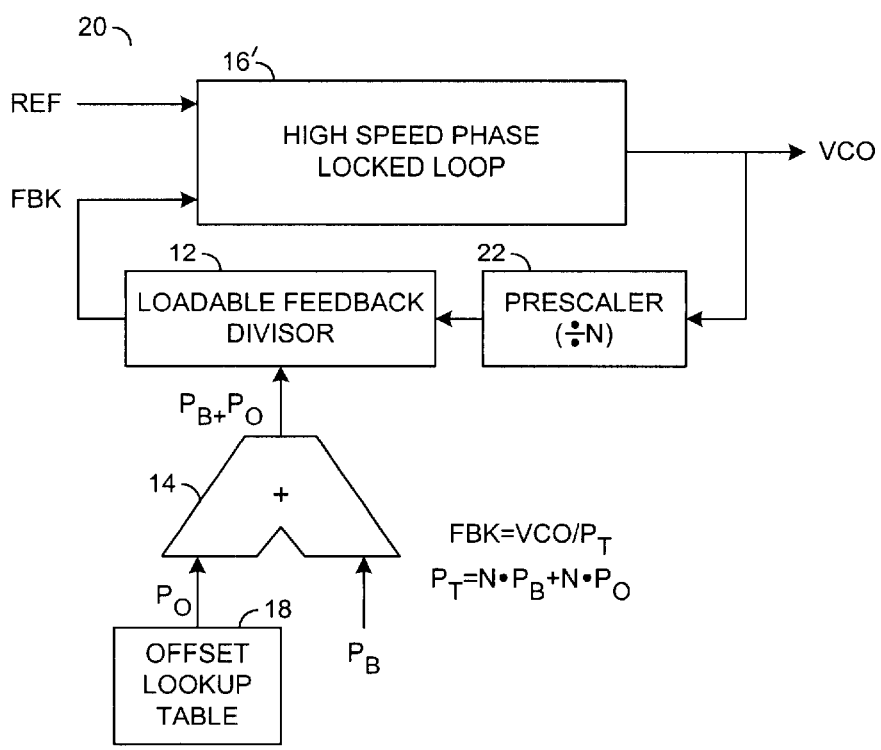
FIG. 2 is a block diagram of another conventional frequency synthesis circuit.
Figure 3:
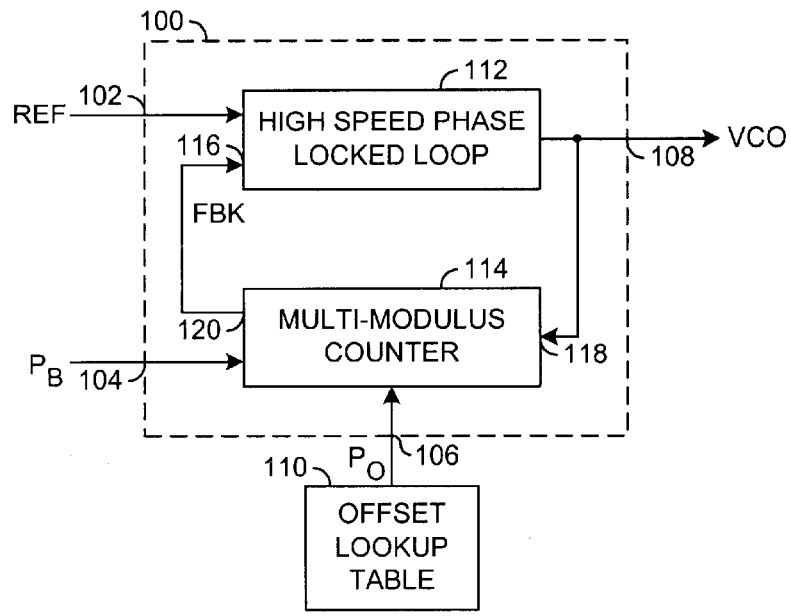
FIG. 3 is a block diagram of a preferred embodiment of the present invention.

Referring to FIG. 3, a block diagram of a circuit 100 is shown in accordance with a preferred embodiment of the present invention. The circuit 100 may be implemented as a programmable modulated frequency synthesizer circuit. The circuit 100 may have an input 102 that may receive a signal (e.g., REF), an input 104 that may receive a signal (e.g., PB), an input 106 that may receive a signal (e.g., PO), and an output 108 that may present a signal (e.g., VCO). The signal REF may be a reference frequency signal. The signal PB may comprise a base PLL feedback value. The signal PO may comprise one or more offset feedback value. The signal PO may be generated, in one example, by a look-up table 110. The circuit 100 may be configured to generate the signal VCO in response to the signals REF, PB and P0.

The circuit 100 may comprise a circuit 112 and a circuit 114. The circuit 112 may be implemented, in one example, as a phase lock loop (PLL) circuit. The circuit 114 may be implemented as a multi-modulus counter circuit. The signal REF may be presented to an input of the circuit 112. A signal (e.g., FBK) may be presented to an input 116 of the circuit 112. The signal VCO may be presented at an output of the circuit 112. The circuit 112 may be configured to generate the signal VCO in response to the signals REF and FBK.

The circuit 114 may be configured to receive the signals PB and PO. The circuit 114 may have an input 118 that may receive the signal VCO. The circuit 114 may have an output 120 that may present the signal FBK. The circuit 114 may be configured to generate the signal FBK in response to the signals PB, PO and VCO. The signal FBK may be implemented as the signal VCO divided by a total feedback divisor. In one example, the circuit 114 may be configured to count a first number of periods (e.g., determined by the value PO) containing N+1 intervals and a second number of periods (e.g., determined by the value PB) containing N intervals, where the intervals equal one period of the signal VCO.

In general, the signal PB may be used to set a base frequency to be generated by the circuit 100. The signal PO may be used to generate a modulation about the base frequency determined by the signal PB. The rate at which the signal VCO may be modulated may be controlled by the addressing of a look-up table configured to generate the signal PO.

Figure 4:
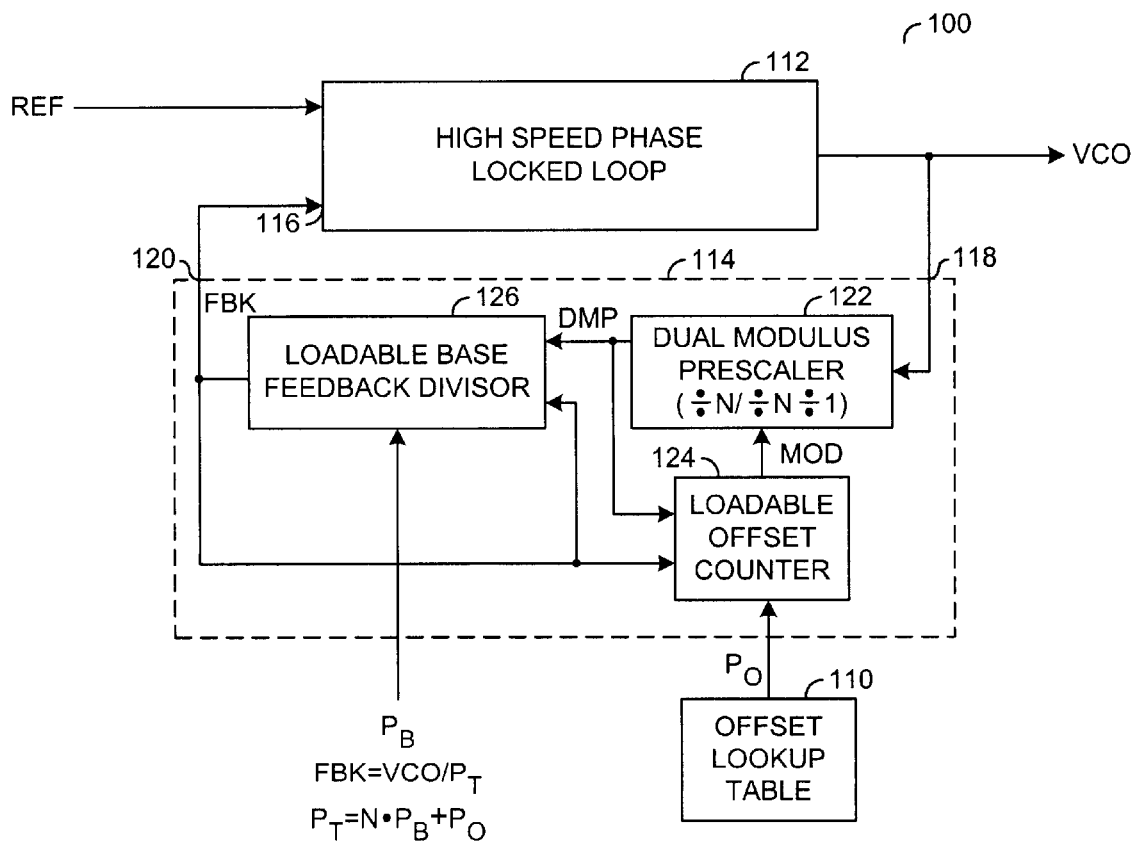
FIG. 4 is a more detailed block diagram of the circuit of FIG. 3.

Referring to FIG. 4, a more detailed block diagram of the circuit 100 is shown. The circuit 114 may comprise a circuit 122, a circuit 124 and a circuit 126. The circuit 122 may be implemented, in one example, as a dual-modulus prescaler circuit. The circuit 124 may be implemented, in one example, as a loadable offset counter. The circuit 126 may be implemented, in one example, as a loadable base feedback counter. The circuit 122 may have a first input that may receive the signal VCO, a second input that may receive a control signal (e.g., MOD), and an output that may present a signal (e.g., DMP). The circuit 122 may be configured to generate the signal DMP in response to the signals VCO and MOD. The circuit 122 may be configured to divide the signal VCO by a modulus value selected in response to the signal MOD. In one example, the circuit 122 may select a modulus of either N or N+1 depending on a state of the signal MOD.

The circuit 126 may have a first input that may receive the signal PB, a second input that may receive the signal FBK, a third input that may receive the signal DMP and an output that may present the signal FBK. The. circuit 126 may be clocked by the output of the circuit 122 (e.g., the signal DMP). The circuit 126 may be configured to generate the signal FBK in response to the signals PB, DMP and FBK. In one example, the circuit 126 may be implemented as a loadable base feedback counter circuit. The circuit 126 may be configured to load the value PB in response to the signal FBK. The circuit 126 may count from the value PB in response to the signal DMP. When the circuit 126 completes a count from the value PB, the circuit 126 may generate the signal FBK.

The circuit 124 may have an input that may receive the signal PO, an input that may receive the signal DMP and an input that may receive the signal FBK. The circuit 124 may be configured to generate the signal MOD in response to the signals DMP, FBK and PO. The circuit 124 may be clocked by the output of the circuit 122 (e.g., the signal DMP), and may be used to control the state of a count control input of the circuit 122. The circuit 124 may be configured to generate the signal MOD to configure the circuit 122 to divide by N+1 for PO cycles. The circuit 124 may be further configured to configure the circuit 122 to divide by N for PB-PO cycles. The circuit 126 may be clocked by the signal DMP from the circuit 122. The circuit 126 generally counts PB clock cycles and is then reloaded along with the circuit 124. The signal FBK may toggle at a rate given by the equation FBK=VCO/PT where PT is given by the equation PT=(N+1)*PO+N*(PB−PO), or PT=(N*PB)+PO. In general, the offset value PO is not multiplied by the prescaler value N, improving frequency resolution relative to the conventional approach. In turn, the frequency modulation synthesis may be less sensitive to PLL loop gain, improving performance and reducing variation across process and environmental conditions.

Figure 5:
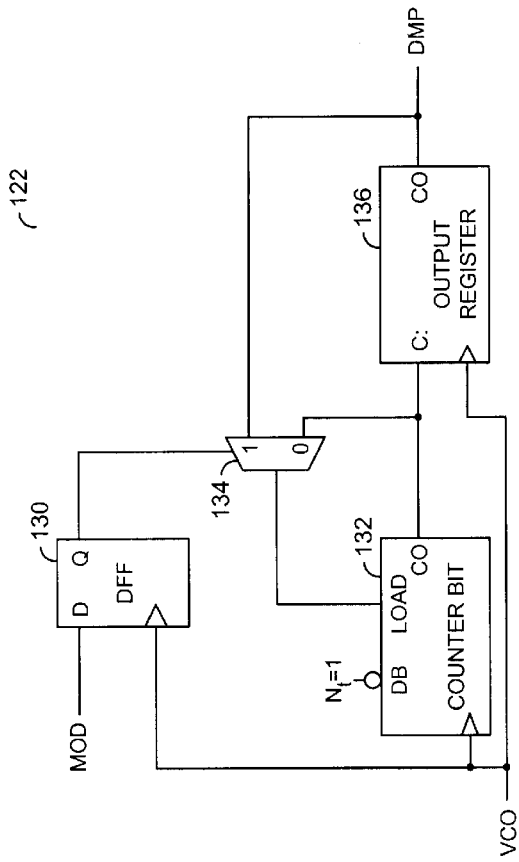
FIG. 5 is a more detailed block diagram of a dual modulus prescaler block of FIG. 4.

Referring to FIG. 5, a more detailed block diagram of the circuit 122 of FIG. 4 is shown. The circuit 122 may comprise a register 130, a counter 132, a multiplexer 134 and a register 136. The register 130 may be implemented as a flip-flop, a register or a latch. In one example, the register 130 may be implemented as a D-type flip-flop. However, other types of flip-flops may be implemented accordingly to meet the design criteria of a particular application. The signal MOD may be presented to an input of the register 130. The signal VCO may be presented to a clock input of the register 130, the counter 132 and the register 136. An output of the register 130 may be coupled to a control input of the multiplexer 134. An output of the multiplexer 134 may be connected to a control input (e.g., a load input) of the counter 132. An input of the counter 132 may be set to a predetermined value. In one example, the predetermined value may be a logical 1. An output of the counter 132 may be connected to an input of the register 136 and a first input of the multiplexer 134. An output of the register 136 may be connected to a second input of the multiplexer 134. The signal DMP may be presented at the output of the register 136.

Figure 6:
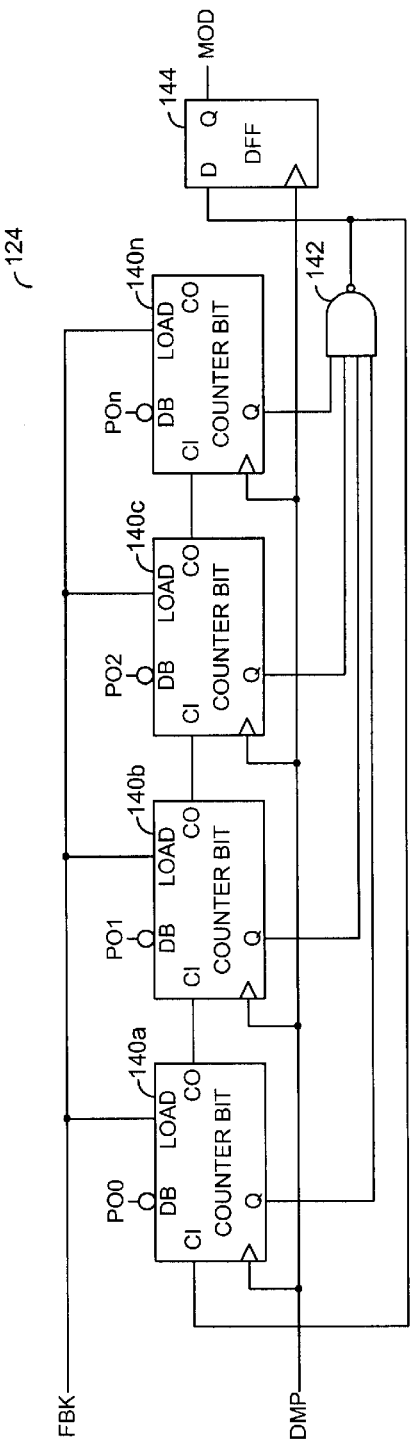
FIG. 6 is a more detailed block diagram of an offset counter block of FIG. 4.

Referring to FIG. 6, a more detailed block diagram of the circuit 124 of FIG. 4 is shown. The circuit 124 may comprise a number of counter bits 140a–140n, a gate 142 and a storage element 144. The storage element 144 may be implemented as a register, a latch, or a flip-flop. In one example, the storage element 144 may be implemented as a D-type flip-flop. In one example, the number of counter bits implemented may be 4. The gate 142 may be implemented as an N-input NAND gate. However, other types of gates may be implemented to meet the design criteria of a particular application. The signal FBK may be presented to a control input (e.g., a load input) of each of the counter bits 140a–140n. The signal DMP may be presented to a clock input of each of the counter bits. An input of each of the counter bits may receive a bit of the signal PO. The counter bits 140a–140n may be connected in series. For example, a carry output of a first counter bit (e.g., 140i) may be connected to a carry input of a next counter bit (e.g., 140i+1). An output (e.g., a Q-output) of each of the counter bits may be connected to an input of the gate 142. An output of the gate 142 may be connected to an input of the storage element 144 and a carry input of the counter bit 140a. The signal MOD may be presented at an output of the storage element 144.

Figure 7:
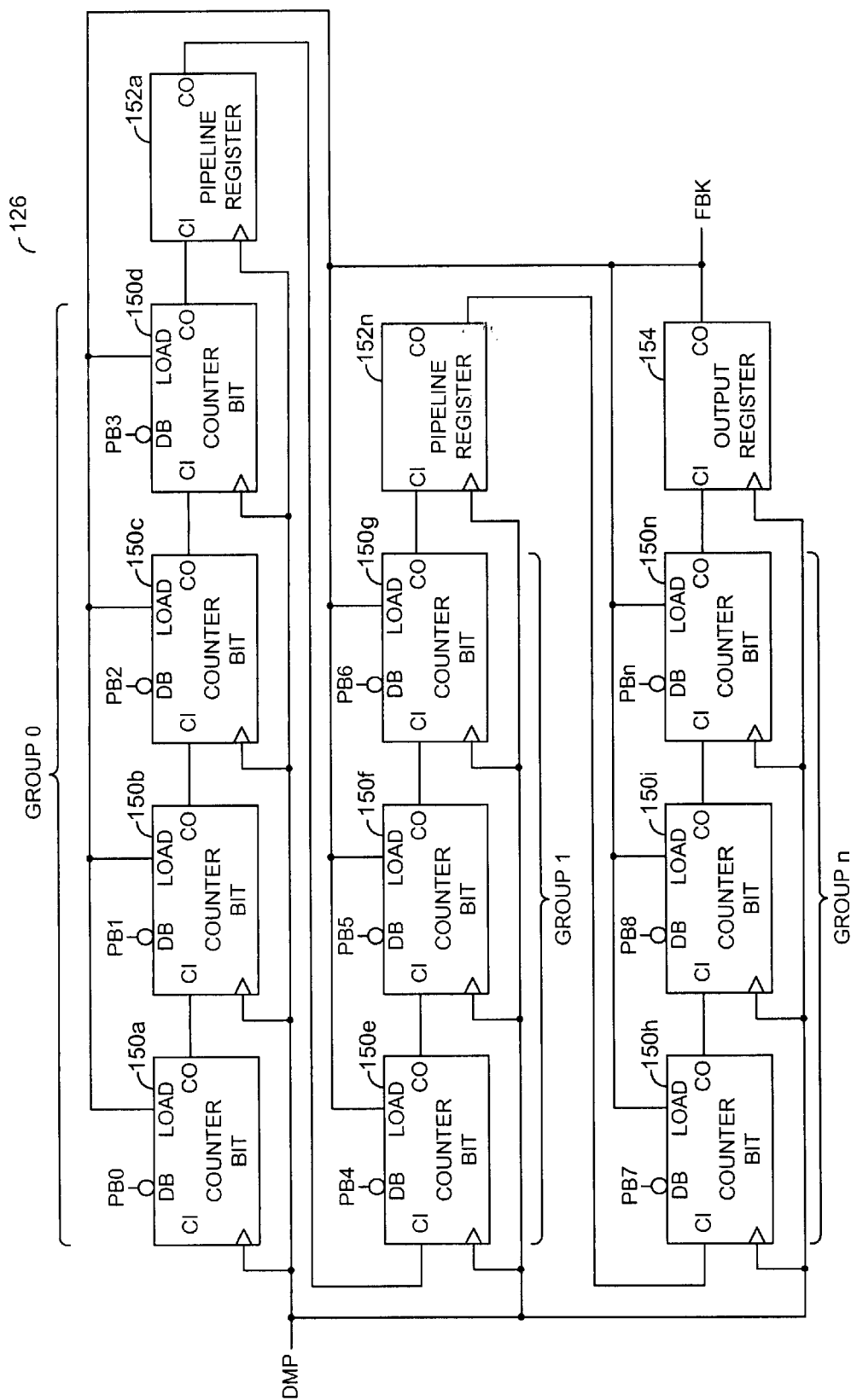
FIG. 7 is a more detailed block diagram of a base feedback divisor block of FIG. 4.

Referring to FIG. 7, a more detailed block diagram illustrating a loadable feedback counter of FIG. 4 is shown. The circuit 126 may comprise a number of counter bits 150a–150n, a number of pipeline registers 152a–152n and an output register 154. The number of counter bits 150a–150n each may have an input that may receive one bit of the signal PB (e.g., PB0–PBn), a load input that may receive the signal FBK and a clock input that may receive the signal DMP. The counter bits 150a–150n may be divided into a number of groups (e.g., Group1–Groupn). In one example, the number of groups may be 3. The pipeline registers 152a–152n may be used to couple a last counter bit of a particular group to a first counter bit of a next group. A carry-out signal of a first counter bit in a group (e.g., 150i) may be connected to a carry-in input of a second counter bit of the group (e.g., 150i+1). A carry-out signal of a group may be presented to a carry-in input of a pipeline register. An output of the pipeline register may be connected to a carry input of a first counter bit of a next group. A carry-out signal of a last counter bit (e.g., the counter bit 150n) may be connected to an input of the register 154. The signal DMP may be presented to a clock input of the register 154. The signal FBK may be presented at an output of the register 154.

The present invention may be used, in one example, in conjunction with a lookup table of offset values, to synthesize a modulated frequency where the modulation profile is programmable. In general, the offset value PO is not multiplied by the prescaler value (e.g., N), improving frequency resolution relative to the conventional method. The present invention may provide frequency modulation synthesis that is less sensitive to PLL loop gain, improving performance and reducing variation across process and environmental conditions. The present invention may also eliminate the need for an adder.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate an output signal having a frequency in response to a reference input and a feedback signal; and
    a second circuit configured to generate said feedback signal according to a plurality of moduli in response to said output signal, a first control signal and a second control signal, wherein said frequency of said output signal is modulated in response to said second control signal.

2. The apparatus according to claim 1, wherein said first circuit comprises a phase lock loop circuit.

3. The apparatus according to claim 1, wherein said second circuit comprises a multi-modulus counter.

4. The apparatus according to claim 1, further comprising a look-up table configured to generate said second control signal.

5. The apparatus according to claim 1, wherein said second circuit comprises a dual-modulus prescaler and a loadable counter.

6. The apparatus according to claim 5, wherein said loadable counter comprises a plurality of counter bits.

7. The apparatus according to claim 6, wherein said loadable counter further comprises one or more registers.

8. The apparatus according to claim 6, wherein said loadable counter further comprises a detector circuit configured to detect when said plurality of counter bits have similar states.

9. The apparatus according to claim 5, wherein said dual-modulus prescaler comprises:
    a flip-flop configured to select a modulus of said dual-modulus prescaler;
    a counter configured to load an offset value; and
    a register.

10. The apparatus according to claim 1, wherein said frequency is spread spectrum modulated.

11. The apparatus according to claim 1, wherein said frequency is modulated in response to a modulation profile.

12. The apparatus according to claim 11, wherein said modulation profile is stored in a look-up table coupled to said second circuit.

13. An apparatus comprising:
    means for generating an output signal having a frequency in response to a reference signal and a feedback signal; and
    means for modulating said frequency of said output signal configured to generate said feedback signal according to a plurality of moduli in response to said output signal, a first control signal and a second control signal.

14. A method for synthesizing a spread spectrum modulated frequency comprising the steps of:
    (A) generating an output signal having a frequency in response to a reference signal and a feedback signal;
    (B) generating said feedback signal according to two or more moduli in response to said output signal, a first control signal and a second control signal; and
    (C) modulating the frequency of said output signal in response to said second control signal.

15. The method according to claim 14, wherein step (A) comprises the step of:
    adjusting the frequency of the output signal to match a phase of the feedback signal to a phase of the reference signal.

16. The method according to claim 14, wherein step (B) comprises the steps of:
    selecting a first modulus in response to a first state of a modulating signal; and
    selecting a second modulus in response to a second state of said modulating signal.

17. The method according to claim 16, further comprising the step of:
    generating the modulating signal in response to the second control signal.

18. The method according to claim 14, further comprising the step of storing a number of offset values describing a modulation profile in a look-up table.

19. The method according to claim 18, further comprising the step of:
    presenting values retrieved from the look-up table as said second control signal.

20. The method according to claim 19, further comprising the step of:
    controlling a rate of modulation of said frequency in response to addressing of said look-up table.

* * * * *